US010748597B1

(12) United States Patent
Caporale et al.

(10) Patent No.: US 10,748,597 B1
(45) Date of Patent: Aug. 18, 2020

(54) METHOD AND SYSTEM FOR WRITING TO AND READING FROM A MEMORY DEVICE

(71) Applicant: XEROX CORPORATION, Norwalk, CT (US)

(72) Inventors: Christopher P. Caporale, Rochester, NY (US); Alberto Rodriguez, Webster, NY (US); Markus R. Silvestri, Fairport, NY (US); Terry L. Street, Fairport, NY (US); Ron Edward Dufort, Rochester, NY (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 16/389,535

(22) Filed: Apr. 19, 2019

(51) Int. Cl.
*G11C 11/22* (2006.01)
*G11C 11/56* (2006.01)

(52) U.S. Cl.
CPC ...... *G11C 11/2275* (2013.01); *G11C 11/2257* (2013.01); *G11C 11/2273* (2013.01); *G11C 11/5657* (2013.01)

(58) Field of Classification Search
CPC .......... G11C 2207/104; G11C 11/2275; G11C 11/2257
See application file for complete search history.

(56) References Cited

U.S. PATENT DOCUMENTS

| 2004/0062071 | A1 | 4/2004 | Rodriguez et al. |
| 2018/0268916 | A1* | 9/2018 | Silvestri ................. G11C 29/10 |
| 2020/0145006 | A1* | 5/2020 | Lin ..................... H01L 27/2409 |

* cited by examiner

*Primary Examiner* — Han Yang
(74) *Attorney, Agent, or Firm* — MH2 Technology Law Group LLP

(57) ABSTRACT

A computer-implemented method for writing to and reading from a printed memory device is provided. Data to be written to the printed memory device is segmented into a plurality of data portions. Each data portion of the plurality of data portions is written to a memory cell of the printed memory as a tuple using a determined encoding scheme that is characterized by a voltage and a pulse width. The voltage that is used for the encoding scheme is within a predetermined polarization regime of the printed memory device. Tuples of data can be read from memory cells of the printed memory using a decoding scheme.

20 Claims, 8 Drawing Sheets

|     | BL0   | BL1   | BL2   |
|-----|-------|-------|-------|
| WL0 | Cell 0 | Cell 1 | Cell 2 |
| WL1 | Cell 3 | Cell 4 | Cell 5 |
| WL2 | Cell 6 | Cell 7 | Cell 8 |

FIG. 9A

|     | BL0   | BL1   | BL2   |
|-----|-------|-------|-------|
| WL0 | Cell 0 | Cell 1 | Cell 2 |
| WL1 | Cell 3 | Cell 4 | Cell 5 |
| WL2 | Cell 6 | Cell 7 | Cell 8 |

FIG. 9B

|     | BL0   | BL1   | BL2   |
|-----|-------|-------|-------|
| WL0 | Cell 0 | Cell 1 | Cell 2 |
| WL1 | Cell 3 | Cell 4 | Cell 5 |
| WL2 | Cell 6 | Cell 7 | Cell 8 |

FIG. 9C

|     | BL0   | BL1   | BL2   |
|-----|-------|-------|-------|
| WL0 | Cell 0 | Cell 1 | Cell 2 |
| WL1 | Cell 3 | Cell 4 | Cell 5 |
| WL2 | Cell 6 | Cell 7 | Cell 8 |

FIG. 9D

|     | BL0   | BL1   | BL2   |
|-----|-------|-------|-------|
| WL0 | Cell 0 | Cell 1 | Cell 2 |
| WL1 | Cell 3 | Cell 4 | Cell 5 |
| WL2 | Cell 6 | Cell 7 | Cell 8 |

FIG. 9E

METHOD AND SYSTEM FOR WRITING TO AND READING FROM A MEMORY DEVICE

TECHNICAL FIELD

The present teachings relate to the field of memory devices, and more particularly, to a method and system to write to and read from a printed memory device.

BACKGROUND

Xerox Printed Memory ("XPM") is a printed label that is capable of including rewritable memory. In one exemplary use, the labels may be used for testing to determine whether a product is faulty or functional, as well as authentic or genuine to prevent counterfeiting. For example, the printed memory may be attached as a label onto a consumable product, supply, shipment packaging, consumer product, document, customer-replaceable product, etc. Data from the printed memory may be read and compared to an expected result or value. If the value read from the printed memory by a memory reader matches the expected value, circuitry within the memory reader can identify the printed memory (and thus the item to which it is attached) as functional and/or authentic. In some uses, identification of the product as functional and/or authentic may be required before the product to which the printed memory is attached is allowed to function, in which case the memory reader, or a host device that incorporates the memory reader as a subsystem, can allow or enable functionality of the product. If the value read from the printed memory does not match the expected value, the circuitry within the reader or host device can designate the printed memory, and thus the item to which the printed memory is attached, as not functional and/or authentic, for example, as counterfeit, gray market, not manufactured by an original equipment manufacturer ("OEM") or a licensed manufacturer (i.e., non-OEM), etc. In some uses, the memory reader or host device can disable functionality of the product if the label attached to the product is identified as not functional and/or authentic.

In another implementation, XPM may be used to track a product through a manufacturing process and/or a supply chain. The labels can be programmed to mark individual items with a unique electronic identifier that may be verified with a memory reading device. Other uses for XPM are contemplated including, but not limited to, smart consumables where an object is associated with data that is later used by a base unit to improve or optimize performance, consumption records where bulk usage of a product supply is tracked, tracking of items or people outside of a manufacturing environment, etc.

A XPM includes a layer of ferroelectric material (i.e., a ferroelectric layer) that uses the polarization of a cell as a data bit and is positioned between a plurality of wiring lines (e.g., word lines and bit lines). A region of the ferroelectric layer situated between each bit line ("BL") and word line ("WL") forms a memory cell. The memory may be written with one of two digital memory states by applying a suitable write voltage to the wiring lines. The memory state may be read by applying a suitable read voltage to the wiring lines through contact pads. If the polarization of the cell is in the opposite direction of the electric field from the applied bias, then, the polarization changes or flips direction inducing a current that gets integrated into a charge value. A cell that has its polarization vector already aligned with the electric field will not flip; hence, produces a smaller charge value equivalent to the capacitive charge value of the cell. Thus, by the very nature of the reading process the information on the chip is destroyed because at the end of the reading process the polarization of all the cells point into the same direction. This currently means 1 cell contains 1 bit. The cell is either polarized with the polarization pointing to the word line representing a 0 or in the opposite direction representing a 1. The existing XPM has a memory depth of 25 bits, or 25 ferroelectric cells. The simplified geometry of the XPM consists on tracing 5 bit lines across 5 word lines on opposite sides of ferroelectric material film thus forming a 5×5 array that yields the 25-bit memory depth.

Accordingly, what is needed is an improved method for writing to and reading from a XPM.

SUMMARY

The following presents a simplified summary in order to provide a basic understanding of some aspects of one or more implementations of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In accordance with examples of the present disclosure, a computer-implemented method for writing to a printed memory device is provided. The computer-implemented method comprises obtaining, at a microcontroller, data to write to the printed memory device; segmenting, by the microcontroller, the data into a plurality of data portions; determining, by the microcontroller, a plurality of encoding schemes for each of the plurality of data portions, wherein each of the plurality of encoding schemes comprises a voltage and a pulse width to be used to write each of the plurality of data portions; providing, by the microcontroller, one or more of the encoding schemes to an application-specific integrated circuit (ASIC); selecting, by the ASIC, a first target memory cell of the printed memory device corresponding to a first word line and a first bit line for the first data portion of the plurality of data portions to be written; setting, by the ASIC, unaddressed word lines and bit lines in high impedance; writing, by the ASIC, the first data portion to the first target memory cell using a first encoding scheme of the plurality of encoding schemes, wherein the first encoding scheme comprises a first voltage and a first pulse width.

In some examples, the computer-implemented method can further comprise determining, by the microcontroller, that a second data portion of the plurality of data portions is to be written; selecting, by the ASIC, a second target memory cell of the printed memory device corresponding to a second word line and a second bit line for the second data portion of the plurality of data portions to be written; setting, by the ASIC, unaddressed word lines and bit lines in high impedance; writing, by the ASIC, the second data portion to the second target memory cell using a second encoding scheme of the plurality of encoding schemes, wherein the second encoding scheme comprises a second voltage and a second pulse width.

In some examples, the computer-implemented method can further comprise determining, by the microcontroller, that a third data portion of the plurality of data portions is to be written; selecting, by the ASIC, a third target memory cell of the printed memory device corresponding to a third word line and a third bit line for the third data portion of the plurality of data portions to be written; setting, by the ASIC, unaddressed word lines and bit lines in high impedance; writing, by the ASIC, the third data portion to the third target memory cell using a third encoding scheme of the plurality of encoding schemes, wherein the third encoding scheme comprises a third voltage and a third pulse width.

In some examples, the computer-implemented method can further comprise determining, by the microcontroller, that a fourth data portion of the plurality of data portions is to be written; selecting, by the ASIC, a fourth target memory cell of the printed memory device corresponding to a fourth word line and a fourth bit line for the fourth data portion of the plurality of data portions to be written; setting, by the ASIC, unaddressed word lines and bit lines in high impedance; writing, by the ASIC, the fourth data portion to the fourth target memory cell using a fourth encoding scheme of the plurality of encoding schemes, wherein the fourth encoding scheme comprises a fourth voltage and a fourth pulse width.

In some examples, the first word line and the second word line can be the same word line or a different word line. In some examples, the first bit line and the second bit line can be the same bit line or a different bit line.

In some examples, the first voltage, the second voltage, the third voltage, and the fourth voltage are within a non-linear region ADC values versus drive voltage curve of the printed memory device. In some examples, the first voltage, the second voltage, the third voltage, and the fourth voltage are between about 1 volt to about 40 volts. In some examples, the first voltage, the second voltage, the third voltage, and the fourth voltage are between 13 volts and about 22 volts. In some examples, the non-linear region corresponds to charge values between about 0.1 nC to about 10 nC. In some examples, the non-linear region corresponds to charge values between about 0.5 nC to about 7 nC. In some examples, the non-linear region is divided into four encoding regimes that correspond to a first charge value less that 1 nC, a second charge value between 3 nC and 5 nC, a third charge value between 5 nC and 6 nC, and a fourth value between 6 nC and 9 nC. In some examples, the first encoding scheme and the second encoding scheme are identical for identical data values of the first data portion and the second data portion. In some examples, each of the data portions comprise a tuple of bit values. For example, the tuple can be a 2-tuple, 3-tuple, . . . , n-tuple, where n is greater than 1.

According to examples of the present disclosure, a computer-implemented method for reading from a printed memory device is provided. The computer-implemented method comprises providing, by a microcontroller, a first control instruction to set a full voltage to an application-specific integrated circuit (ASIC); providing, by the microcontroller, a first read instruction to the ASIC to read a first portion of a data from a first cell of the printed memory device; reading, by the ASIC, the first cell, wherein the reading comprises determining a first charge measurement and a second charge measurement; obtaining, by the microcontroller, the first charge measurement and the second charge measurement from the ASIC; determining, by the microcontroller, a difference between the first charge measurement and the second charge measurement; accessing, by the microcontroller, a look-up table to convert the difference to a decoded set of bit values; and providing, by the microcontroller, the decoded bit values.

In some examples, the look-up table provides a correspondence between a difference in analog-to-digital count (ADC) values based on the first charge measurement and the second charge measurement and decoded bit values. In some examples, the ADC values are divided into a plurality of non-overlapping ADC value regimes. In some examples, the plurality of ADC values regimes is four ADC value regimes. In some examples, the four ADC value regimes comprise less than 10, between 10 and 70, between 70 and 110, and greater than 110. In some examples, the first charge measurement and the second charge measurement are converted to a first analog-to-digital count (ADC) value and a second ADC value, respectively, by an analog-to-digital converter.

BRIEF DESCRIPTION OF THE DRAWINGS

The accompanying drawings, which are incorporated in, and constitute a part of this specification, illustrate implementations of the present teachings and, together with the description, serve to explain the principles of the disclosure. In the figures:

FIGS. 9A, 9B, 9C, 9D, 9E show a 3×3 printed memory device during the write process according to examples of the present disclosure.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary implementations of the present teachings, examples of which are illustrated in the accompanying drawings. Wherever convenient, the same reference numbers will be used throughout the drawings to refer to the same or like parts.

As used herein, "data" refers to any type of information, signal, or other result that is obtained from or sent to an electrical device such as a memory device, an integrated circuit, or another electrical device, or any information obtained from monitoring, interrogating, querying, or measuring, etc., an electrical device. The term "data" includes digital data, analog data, voltage values, current values, resistance values, vector values, scalar values, and/or flux values. As used herein, "bus" refers to a group of word lines and bit lines that are shared between multiple physical connections. As used herein, "cell" refers to the physical, ferroelectric capacitor defined by an intersection of a WL and BL with the ferroelectric material sandwiched between them.

Generally speaking, aspects of the present disclosure provide for increasing, i.e., doubling, the amount of memory available on a given XPM. This technique uses various polarization levels to represent multiple bits in a single cell. This is done by not completely flipping the polarization to put the cell into an intermediate state. These intermediate states are known, controlled, and predictable. These states would be selected via the voltage used to stimulate the memory when writing/reading it. Once the memory is put into this state it can be interrogated to provide a charge response, which is representative of the memory polarization state.

Figure 1:
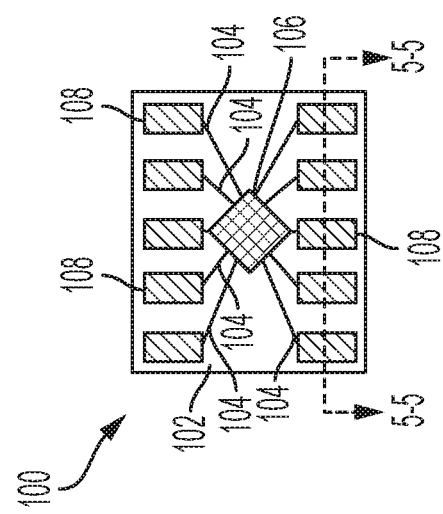
FIG. 1 is a plane view of a printed memory such as a XPM.

An example of a memory device 100, for example, a printed memory (i.e., printed memory device) 100 such as a XPM 100 is depicted in the plane view of FIG. 1. The structure and function of the XPM 100 is known and is only briefly discussed herein. The FIG. 1 printed memory 100 includes a substrate 102, for example, a flexible dielectric substrate 102, such as a flexible polymer substrate, that may include an adhesive backing layer to aid in attachment of the printed memory 100 to a surface of a product, a plurality of wiring lines (e.g., WLs and BLs) 104 and a ferroelectric layer 106 directly interposed or positioned between the WLs and the BLs. A memory cell that stores the logic bit or logic state is provided by and within the ferroelectric layer 106 at the physical location that is interposed between the intersection of each WL and BL. It will thus be appreciated that the WLs and BLs do not physically contact each other, but are physically separated by the ferroelectric layer 106. The printed memory 100 depicted in FIG. 1 includes ten wiring lines 104 (five WLs and five BLs), and thus the FIG. 1 device includes 25 memory cells and may thus store 25 bits of information. Each wiring line 104 terminates in a contact pad 108. Each memory cell can be individually addressed through two of the contact pads (i.e., through one WL and one BL). The plurality of contact pads 108 may be arranged in a rectangular shape in two or more rows and columns as depicted, or they may be arranged in a single column. It will be appreciated that a XPM may include other structures that are not described or depicted for simplicity, while various depicted structures may be removed or modified. Each memory cell of the printed memory 100 may be read by applying a suitable read voltage to two of the wiring lines 104 (i.e., to one word line and one bit line) and measuring an electrical response. To apply the read voltage, the plurality of contact pads 108 can be physically and/or electrically contacted with probe contacts of a reader. A voltage is applied across the contact pads 108 through probe contacts, and the resulting response is measured. Each memory cell may be individually addressed during a read cycle or write cycle (hereinafter, a memory operation), and one or more of the memory cells in the memory array may be read or written simultaneously or serially.

The contact pads 108 of the printed memory 100 and other electrical devices can be formed using a carbon-impregnated composite, electrically conductive inks such as silver nanoparticle ink, or one or more other suitable materials. These contact pads 108 can become scratched and degrade from repeated physical contact with, for example, electrical probes of a reader. Further, when direct physical contact is made between the reader and the printed memory 100, the reader must be correctly oriented with the printed memory 100.

Figure 2:
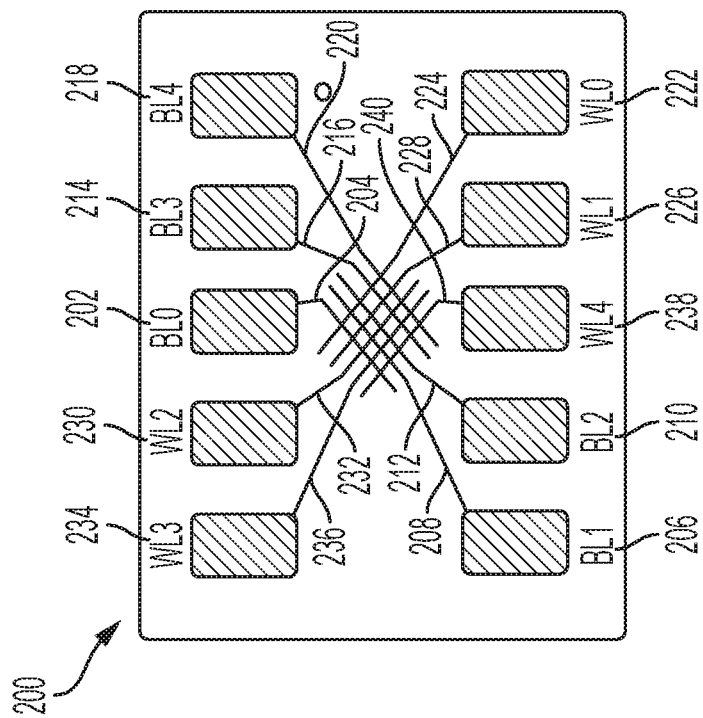
FIG. 2 is a schematic of the memory, showing both WLs and BLs.

FIG. 2 is a schematic of memory 200, showing both WLs and BLs. BL contact pad BL0 202 includes BL 204, BL contact pad BL1 includes 206 BL 208, BL contact pad BL2 210 includes BL 212, BL contact pad BL3 214 includes BL 216, and BL contact pad BL4 218 includes BL 220. WL contact pad WL0 222 includes WL 224, WL contact pad WL1 226 includes WL 228, WL contact pad WL2 230 includes WL 232, WL contact pad WL3 includes 234 WL 236, and WL contact pad WL4 238 includes WL 240.

Figures 3, 4:
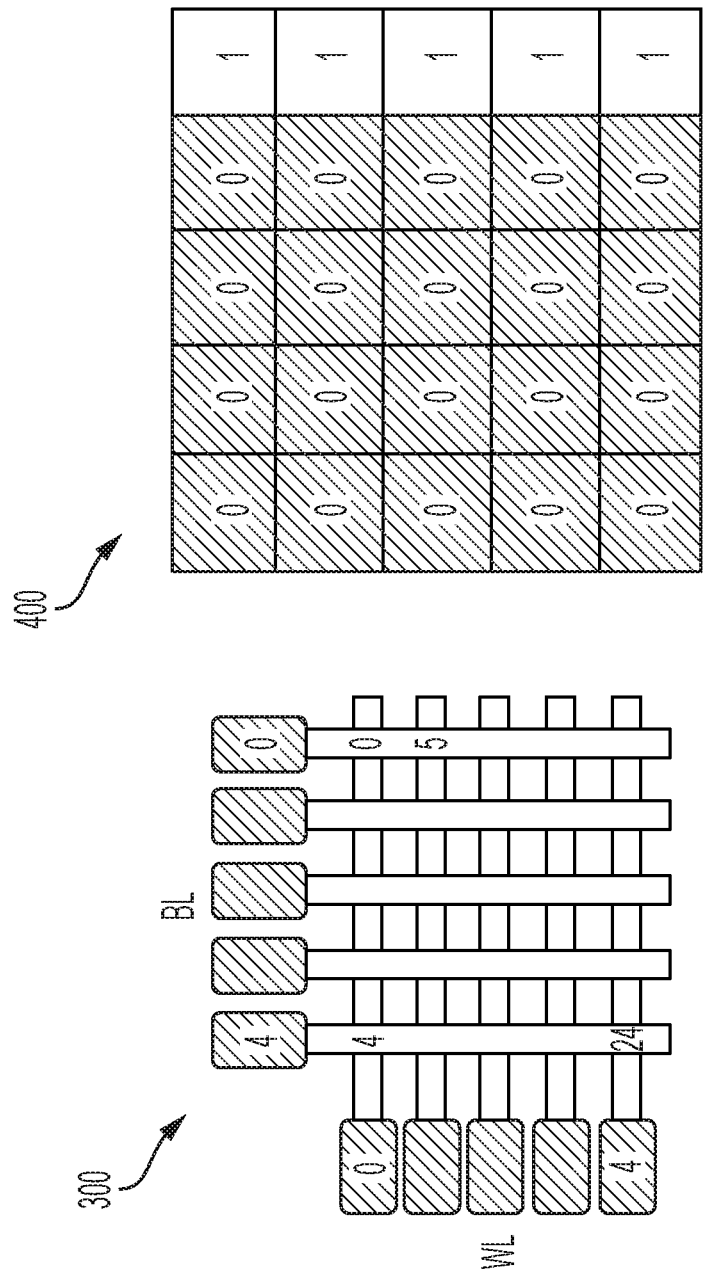
FIG. 3 is a simplified schematic of the memory.
FIG. 4 shows cell analog values as converted into binary values.

FIG. 3 shows a simplified schematic of memory 300, where the numbers on electrode intersections denote the cell ID, according to examples of the present disclosure. If a pad is disconnected, e.g., pad of BL 0 in FIG. 3. then every cell of that BL is floating (cells 0, 5, 10, 15, 20). Three things will happen in the reading process: First, since the BL is floating, there will be no bias across the cells of that BL. Any cells that are in the '0' state will not flip because the driving force is missing. Second, since the bit line is disconnected, no current flows into the integrating amplifier connected to the pad. The charge values will be close to 0. Third, when the analog values are converted, all the cells on this disconnected bit line will be assigned a '1' because their charge values are far below the threshold. If the original pattern was all 0's and bit line 0 was disconnected one would end up with a pattern as shown in FIG. 4. FIG. 4 shows cell analog values 400 that are converted into binary values, where a cell becomes a '0' bit if its charge value is large, according to examples of the present disclosure.

A similar thing happens for a word line. First, since the word line is floating, there will be no bias across the cells of that word line. Any cells that are in the '0' state will not flip because the driving force is missing. Second, because no flipping is taking place, only small capacitive charge values are read on the floating lines. Third, when the analog values are converted, all the cells on this disconnected word line will be assigned a '1' because their charge values are below the threshold.

XPM is a 25-bit memory device which holds information in the form of states. These states are orientations of the polarization of the ferroelectric polymer located between two electrodes. A voltage is applied to create an electric field through the ferrous material. This allows the dipoles to align depending on the direction and magnitude of the field. Certain characteristics of the material, manufacturing process, size, and other physical features determine a minimum voltage required to "flip" the dipoles in the polymer. The S-curve is a graphical representation of polarization switching measured by the charge response of the polymer to the voltage applied vs the applied voltage. An ASIC is used to measure and store the charge response of the polymer. The S-curve shows how much voltage is needed to take the polymer from one "state" to another. Exploiting this switching dependence on applied bias can help further increase cell data storage.

Figure 5:
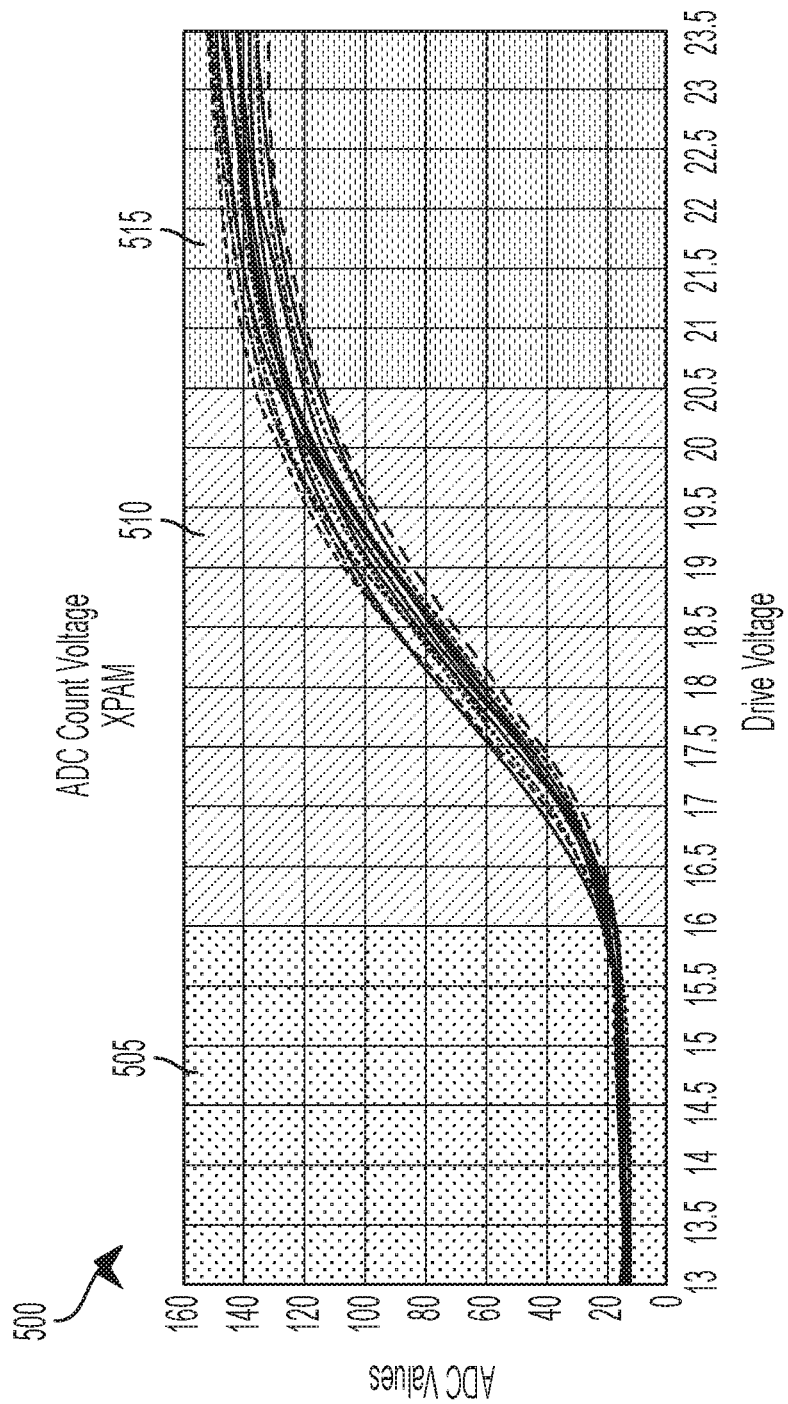
FIG. 5 shows a plot of ADC count versus voltage for a XPM according to examples of the present disclosure.

The S-curve characteristics of XPM devices are exploited by applying several short voltage pulses to their cells and monitoring their responses. Typically, there are three main distinguishable ranges. FIG. 5 shows an example S-curve 500 having these three main ranges depicted, according to examples of the present disclosure. Region 1 505 is a non-flipping region for a given pulse width. In this region the applied voltage is well below the required flipping voltage, but still significant enough to cause a response from a capacitive network. Region 2 510 is a non-linear or switching region. In this region, polarization starts to switch and may continue to switch depending on the applied bias across the cell. The higher the bias the larger the response until it saturates resembling the shape of an '5'; hence, the name S-curve. Obviously, the functional dependence between the charge read (response) and the applied voltage is non-linear. In contrast, a capacitive network would still be linear. Also, ferroelectric polymers different from the present example would show a different S-curve. For example, the non-linear region is divided into four encoding regimes that correspond to a first charge value less that 0.5 nC, a second charge value between 0.5 nC and 3 nC, a third charge value between 3 nC and 4.5 nC, and a fourth value between 4.5 nC and higher. In one example a conversion is 25 ADC counts per 1 nC change. Region 3 515 is a flipped or saturation region. In this region, all the cells are flipped into their new state where their polarization is now in line with the electric field from the applied bias. Any further increase in voltage will only increase the capacitive response of the cell; hence, the response or charge reading would increase slowly in contrast to region 2 510. Different ferroelectric polymers will have different onsets for the flipped region for a given ferroelectric layer thickness; hence, their starting point can be used as a means of differentiation.

By dividing the non-linear region into different regions itself, more data can be encoded into the memory. For instance, using the "Non-flipping" region, a first state could be ADC values less than 10. Another state in the "non-linear region can be defined for ADC counts from 10 to 70. A third state, can be defined from 70 to 110 ADC counts. The final state would be the saturation region, or ADC values above 110. With these four states, two bits of data can be encoded. This method doubles the memory depth of the device without requiring physical changes. This method can also account for temperature changes, as the reading or writing voltage and pulse widths can be configured for the environmental conditions.

This method helps address some concerns about the memory depth of XPM. Scaling memory depth this way is much more practical than changing the manufacturing process to incorporate additional Word Lines and Bit Lines. Instead of the traditional memory depth currently shown in equation 1, the present disclosure provides the added benefit of a $\log_2(N)$ multiplier, which is shown in equation 2, where N is the number in power of 2 of states a memory cell can be put into. Using the 4 states defined above, with the current 5×5 memory, 50 bits can be encoded into the XPM. Without this idea, to gain similar memory depth, a new device comprising of an array of 7×7 memory cells would have to be designed. However, as stated earlier, this approach would be costly and increase the complexity and size of the device. For number of states other than power of 2 one would have to work with a system of a different base, e.g., for N=3, use a ternary system. In these cases positive integers up to $N^M-1$ can be represented where M (=WL*BL) is the number of cells and N the number of levels.

The conventional memory depth can be represented as follows:

$$B = WL*BL \quad (1)$$

The proposed memory depth in accordance with the present teachings can be represented as follows:

$$B = \log_2(N)*(WL*BL) \quad (2)$$

where B number of bits, WL is number of word lines, BL is number of bits lines, N is number of states.

Each trace requires a connection pad to make electrical contact. Increasing the memory depth of the device requires adding traces and connection pads. Physical scalability of XPM however, is not trivial. With each additional trace and contact pad the size of the memory increases significantly. In addition there are also manufacturing complications which would add to cost, complexity, and reduce yield. This is due to new manufacturing equipment needed (or major modifications to the existing one), more accurate registration, and less XPMs on a given surface area.

Figure 6:
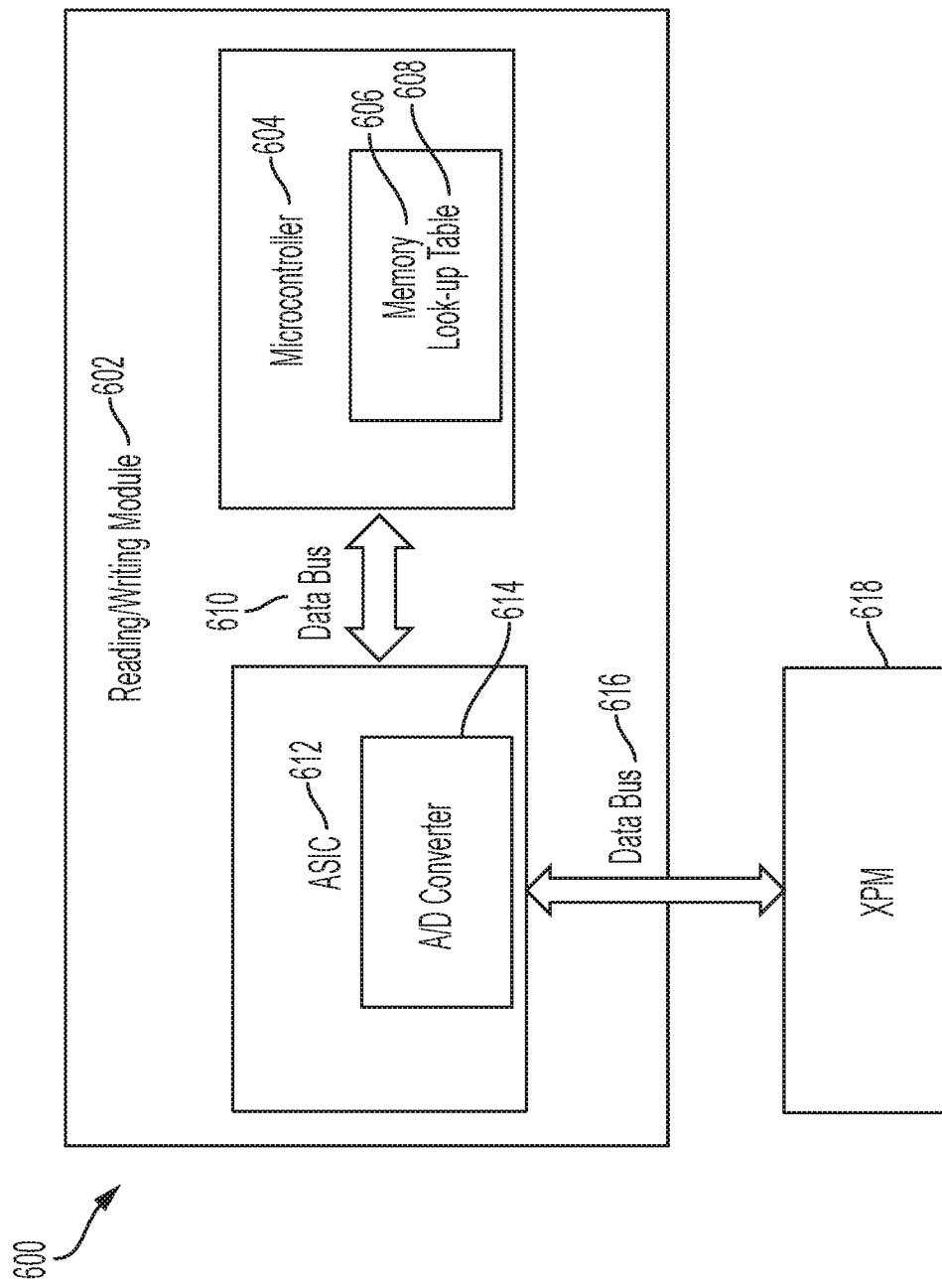
FIG. 6 is a schematic depiction of an electronic system according to examples of present disclosure.

FIG. 6 is a schematic depiction of an electronic system 600 for reading and/or writing to a XPM in accordance with an embodiment of the present teachings. The electronic system 600 comprises a microcontroller 604. The microcontroller 604 comprises a memory 606 that is configured to store a look-up table 608. The look-up table 608 stores an encoding/decoding scheme for converting one or more bits to write voltages and pulse widths or converting ADC values to bit values. The microcontroller 604 communicates with a ASIC 612 over a first data bus 610. The ASIC 612 comprises a A/D converter 614. The ASIC 612 executes read/write operations with the XPM 618 over a second data bus 616.

While FIG. 6 depicts an overview of one possible electronic system 600 design, it will be appreciated that other designs may include other features that are not depicted, while depicted features may be removed or modified. Moreover, the overview of FIG. 6 is not intended to individually depict all supporting electronics such as microprocessors, memory, power supplies, etc., which may be designed into the present teachings by one of ordinary skill in the art.

During the read process, two read operations are performed, where the first read operation includes the charge value associated with both polarization (P) and capacitive (C) effects (P+C) and the second read operation includes just the capacitive (C) effects. The difference between the first read operation and the second read operation ((P+C)−C=P), which result in just the "P".

Note: settings for pulse width and amplitude are applied before each "write." Data to write: 55400AABFF, which is in a hexadecimal representation. In this example, only four word lines using four different charge levels instead of five are used. Therefore, this allows an increased encoding density that extends a conventional encoding from 20 cells encoding 20 bits to an improved encoding of 20 cells encoding 40 bits (2 bits per cell). However, aspects of the present disclosure can be extended to have more bits encoded into the memory. For example, if 16 levels are available, 4 bits per cell can be encoded. This would then extend the below example to have 80 bits of data instead of 40.

Write Command 0 1ffffff
Good Write
Write Command 0 1fffc1f
Good Write
Write Command 0 1ff83ff
Good Write
Write Command 0 1f07fff
Good Write The process above shows that the writing process of the various levels.

TABLE 1

| Decoding Scheme: | ADC1-ADC2 |
|---|---|
| "11" | <10 |
| "10" | 10 < x < 70 |
| "00" | 70 < x < 110 |
| "01" | x > 110 |

Raw ADC values read from memory below

TABLE 2

| | ADC1 | ADC2 | ADC1-ADC2 | Decoded Bits |
|---|---|---|---|---|
| LSB | 25 | 18 | 7 | 11 |
| | 21 | 21 | 0 | 11 |

TABLE 2-continued

|     | ADC1 | ADC2 | ADC1-ADC2 | Decoded Bits |
|-----|------|------|-----------|--------------|
|     | 27   | 25   | 2         | 11           |
|     | 25   | 27   | -2        | 11           |
|     | 26   | 19   | 7         | 11           |
|     | 71   | 29   | 42        | 10           |
|     | 60   | 23   | 37        | 10           |
|     | 54   | 25   | 29        | 10           |
|     | 50   | 20   | 30        | 10           |
|     | 45   | 22   | 23        | 10           |
|     | 108  | 23   | 85        | 00           |
|     | 102  | 25   | 77        | 00           |
|     | 99   | 21   | 78        | 00           |
|     | 101  | 22   | 79        | 00           |
|     | 94   | 18   | 76        | 00           |
|     | 148  | 23   | 125       | 01           |
|     | 143  | 22   | 121       | 01           |
|     | 156  | 23   | 133       | 01           |
|     | 154  | 26   | 128       | 01           |
| MSB | 156  | 24   | 132       | 01           |

In Table 2, LSB means least significant bit and MSB means most significant bit. The binary number is as follows: 0101-0101-0100-0000-0000-1010-1010-1011-1111-1111. The hexadecimal equivalent is 55400AABFF.

During the write process, each cell is written to once put the cell into a certain state representative of two bits of data. The states is one of four states comprising "11," "01," "10," and "00." Consider for example, a WL having five cells. A first portion of data that may be written on that WL to two cells is the "01" state. A second portion of data that may be written to the other three cells is the "00" state.

In another example, each WL would step through the four states of "11," "01," "10," and "00," and apply a high impedance to the cells on that line which are not to be put in that state for that step. This can be illustrated as follows. For WL0: BL0, BL1 are "01," BL2 is "10," BL3 is "11," and BL4 is "00." An encoding scheme for the voltage and pulse width for "11" is sent to the ASIC, and everything but the BL3 is placed in high impedance, and the write is performed. Next, an encoding scheme for "01" is sent to the ASIC, and BL2, BL3, BL4 are all placed in high impedance, then the write is performed. Next, an encoding scheme for "10" is sent to the ASIC and everything but BL2 is placed in high impedance, and the write is performed. Finally, an encoding scheme for "00" is sent to the ASIC and everything but BL4 is placed in high impedance, and the write is performed.

In the examples described herein, the data to be written can be segmented into a plurality of portions to be written in respective memory cells. Table 3 shows an example data segmentation. Consider the data to be written as (0110 . . . 00111010). The first portion (10) of the entire data (0110 . . . 00111010) is written to the first cell by a encoding scheme which would allow the cell to be put into the correct region for a charge reading which corresponds to "10", then the second portion of the data is written to the second cell using the same process. This process continues until all the portions of the data are written to their corresponding cell. Each data portion value that is written is encoded using a specific pulse voltage and pulse width to achieve a distinctive polarization state of the ferroelectric cells. In one non-limiting example, an encoding scheme for "00" is $V_{pulse}=22V$, $\Delta t=16$ µs, an encoding scheme for "01" is $V_{pulse}=18V$, $\Delta t=16$ µs, and an encoding scheme for "10" is $V_{pulse}=16V$, $\Delta t=16$ µs, and an encoding scheme for "11" is no pulse or $V_{pulse}=13V$, $\Delta t=16$ µs. In the read process, switching these polarization states induce four different charge values translating into four different ADC values that get decoded back into "00," "01," "10," and "11" values.

TABLE 3

| 01           | 10              | . . . 00       | 11                       | 10                       | 10                       |
|--------------|-----------------|----------------|--------------------------|--------------------------|--------------------------|
| Nth portion  | (N-1) portion   | . . . $4^{rd}$ portion | $3^{rd}$ portion | $2^{nd}$ portion | $1^{st}$ portion |
| Nth cell     | (n-1) cell      | . . . $4^{th}$ cell | $3^{rd}$ cell | $2^{nd}$ cell | $1^{st}$ cell |

Figure 7:
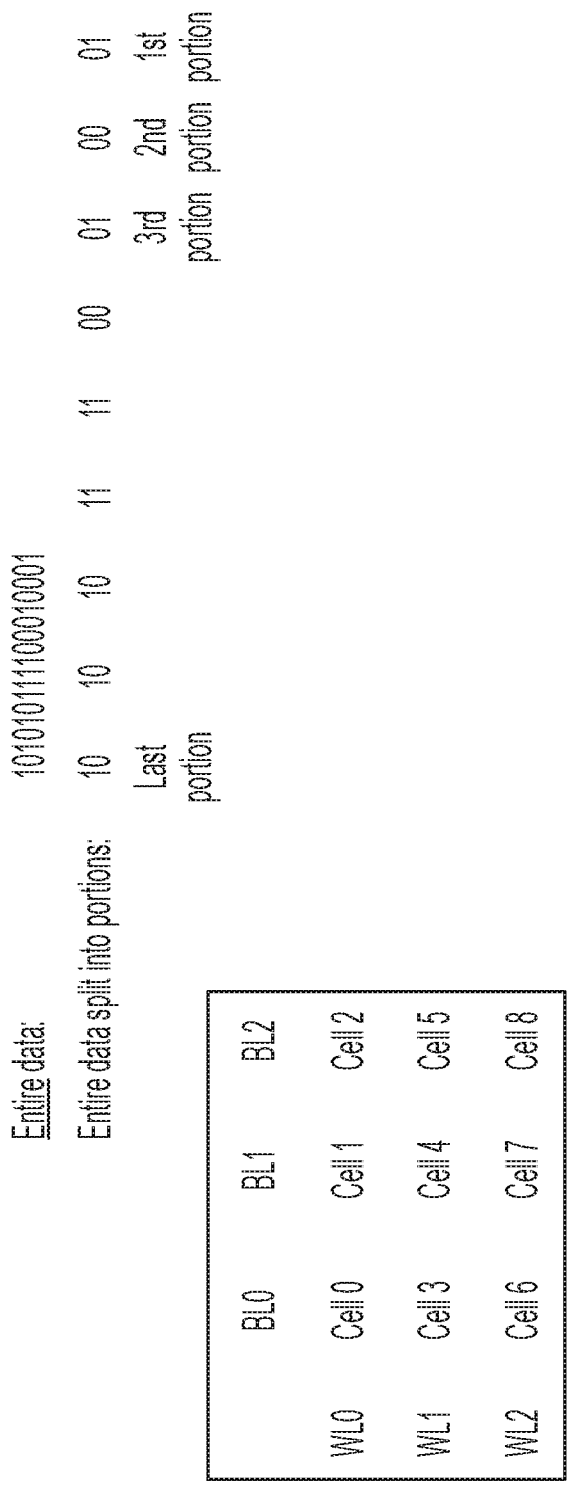
FIG. 7 shows a 3×3 printed memory device and data to be written to the printed memory device according to examples of the present disclosure.

FIG. 7 shows a 3×3 XPM, according to examples of the present disclosure. Cell 0 is at the intersection of WL0 and BL0, Cell 1 is at the intersection of WL0 and BL1, Cell 2 is at the intersection of WL0 and BL2, Cell 3 is at the intersection of WL1 and BL0, Cell 4 is at the intersection of WL1 and BL1, Cell 5 is at the intersection of WL1 and BL2, Cell 6 is at the intersection of WL2 and BL0, Cell 7 is at the intersection of WL2 and BL1, and Cell 8 is at the intersection of WL2 and BL2. FIG. 7 also shows data to be written to the XPM as "101010111100010001," which is segmented into n number of data portions where a $1^{st}$ data portion is "01," a $2^{nd}$ data portion is "00," a $3^{rd}$ data portion is "01," . . . n–1 data portion, i.e., Cell 7, is "10, and a nth data portion, i.e., Cell 8, is "10." There is a one-to-one mapping for each data portion to each cell, i.e., Cell 0 maps to the $1^{st}$ data portion and Cell 1 maps to the $2^{nd}$ data portion, etc.

Figure 8:
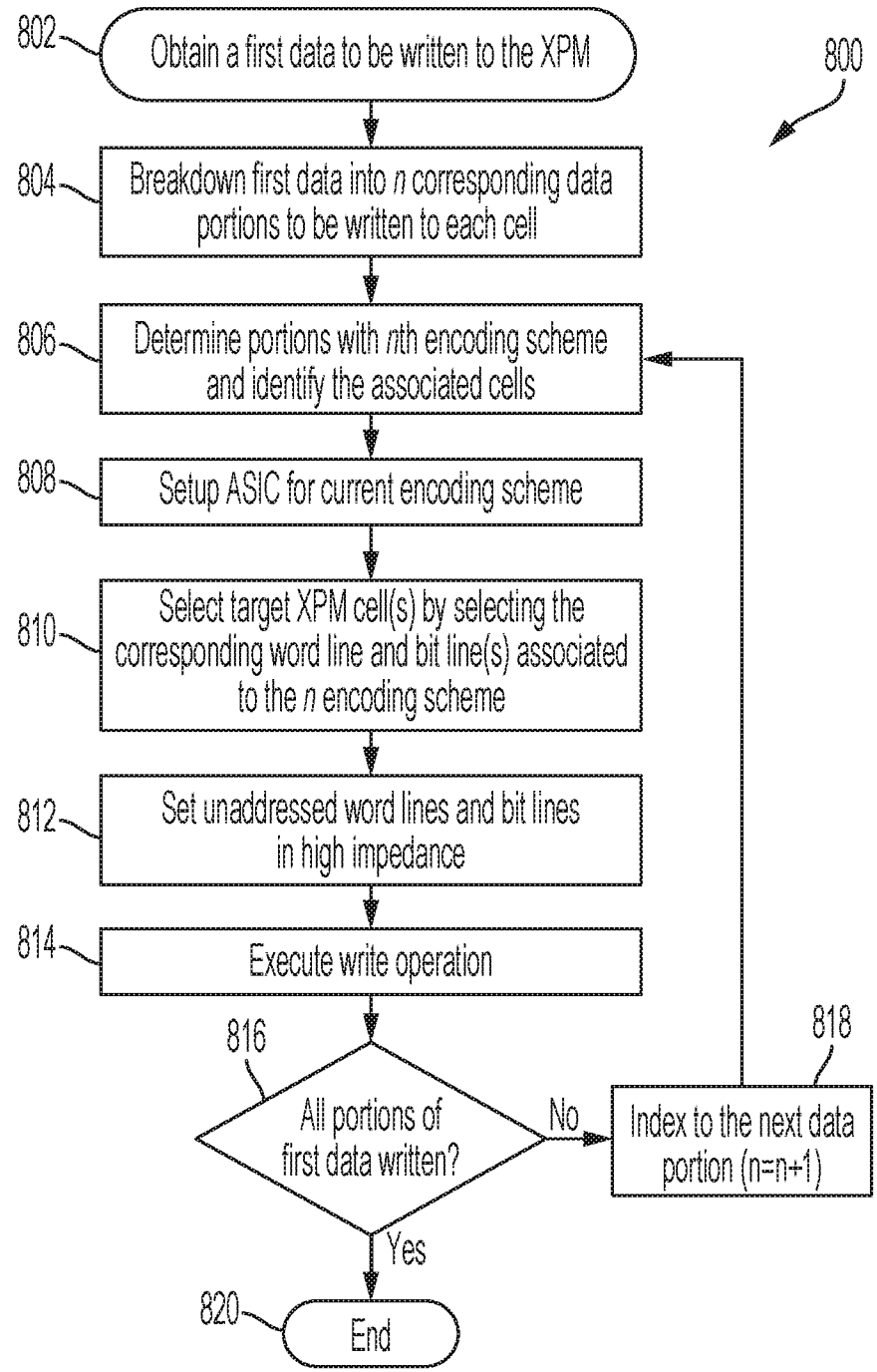
FIG. 8 shows a computer-implemented method for writing data to a printed memory device according to examples of the present disclosure.

FIG. 8 shows a computer-implemented method 800 for writing data to a printed memory device according to examples of the present disclosure. The computer-implemented method 800 begins by obtaining, at 802, first data by the microcontroller 604 to be written to the XPM. Referring to the example shown in Table 3, the first data to be written, (0110 . . . 00111010), is obtained by the microcontroller 604. The computer-implemented method 800 continues by segmenting, at 804, the first data into n corresponding data portions by the microcontroller to be written to each cell of the XPM. Continuing with the example, the microcontroller 604 segments the data to be written into a plurality of data portions (e.g., $1^{st}$ portion ("10"), $2^{nd}$ portion ("10"), $3^{rd}$ portion ("11"), 4th portion ("00"), . . . , n–1th portion ("10"), nth portion ("01")). The computer-implemented method 800 continues by determining, at 806, an encoding scheme (e.g., voltage and pulse width) for each of the nth data portions and identifying a cell of the XPM for which the data portions are to be written by the microcontroller. The computer-implemented method 800 continues by configuring, at 808, the ASIC a current encoding scheme by the microcontroller 604. Referring back to the example, the microcontroller 604 configures the ASIC 612 with an encoding scheme to encode each of the portions of data. The computer-implemented method 800 continues by selecting, at 810, target XPM cell(s) by selecting a corresponding WL and BL(s) associated to the n encoding scheme. The computer-implemented method 800 continues by setting, at 812, unaddressed WLs and BLs in high impedance by the ASIC 612. The computer-implemented method 800 continues by executing, at 814, a write operation by the ASIC 612. The computer-implemented method 800 continues by determining, at 816, whether all data portions of the first data have been written by the microcontroller 605. FIG. 9A shows 3×3 XPM in which "01" is to be written to Cell 0 and Cell 2 using a respective encoding scheme for "01." WL1, WL2, and BL1 are placed in high impedance by the ASIC 612, meaning that those cells on those WLs and BL do not experience a voltage. If the determination at 816 is no, then the computer-implemented method 800 proceeds to 818 where the microcontroller 605 instructs the ASIC 612 to index to the next data portion (n=n+1) and proceed back to 806. FIG. 9B shows the next write operation where "00" is to be written to Cell 1 using a respective encoding scheme for "00" while BL0, BL2, WL1, and WL2 are placed in high impedance by the ASIC 612. FIG. 9C shows the next write operation where "00" is to be written to Cell 3 while BL1, BL2, WL0, and WL2 are placed in high impedance by the ASIC 612. FIG. 9D shows the next write operation where "11" is to be written to Cell 4 and Cell 5 using a respective encoding scheme for "11" while BL0, BL2, WL0, and WL2 are placed in high impedance by the ASIC 612. FIG. 9E shows the next write operation where "10" is to be written to Cell 6, Cell 7, and Cell 8 using a respective encoding scheme for "10" while WL0 and WL1 are placed in high impedance by the ASIC 612. If the determination at 816 is yes, then the computer-implemented method 800 concludes at 820.

Figure 10:
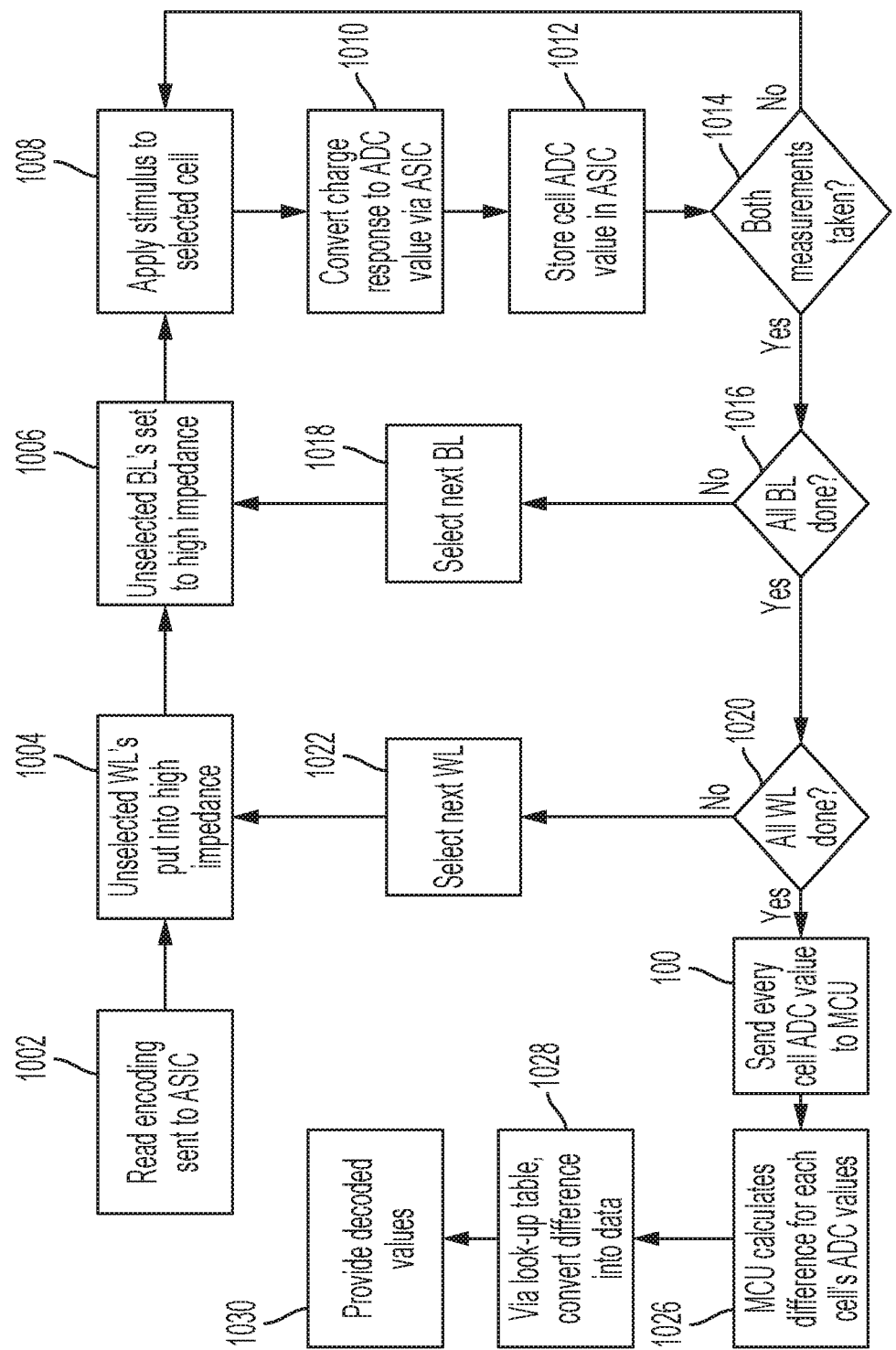
FIG. 10 shows a method for reading data from a printed memory device according to examples of the present disclosure.

FIG. 10 shows a computer-implemented method 1000 for reading data from a printed memory device according to examples of the present disclosure. The computer-implemented method 1000 begins by sending, at 1002, a read encoding to the ASIC 612 by the microcontroller 602. The computer-implemented method 1000 continues by placing, at 1004, unselected WLs in high impedance. The computer-implemented method 1000 continues by placing, at 1006, unselected BLs in high impedance. The computer-implemented method 1000 continues by applying, at 1008, a stimulus to a selected cell that is to be read. The computer-implemented method 1000 continues by converting, at 1010, charge response to the ADC value via the ASIC 612. The computer-implemented method 1000 continues by storing, at 1012, cell ADC values in the ASIC 612. The computer-implemented method 1000 continues by determining, at 1014, whether both measurements have been taken. If the results of the determination at 1014 is no, then the method 1000 returns to 1008. If the result of the determination at 1014 is yes, then the method 1000 proceeds to 1016 where a determination is made as to whether all BLs are done. If the result of the determination at 1016 is no, then the method 1000 proceeds to 1018 where the next BL is selected. The method 1000 then proceeds from 1018 back to 1006. If the results of the determination at 1016 is yes, then the method 1000 proceeds to 1020 where a determination is made as to whether all WLs are done. If the result of the determination at 1020 is no, then the method 1000 proceeds to 1022 where the next WL is selected. The method 1000 then proceeds from 1022 back to 1004. If the results of the determination at 1020 is yes, then the method 1000 proceed to 1024 where every cell's ADC is sent to the microcontroller 602. The method 1000 continues by calculating, at 1026, a difference for each cell's two ADC values by the microcontroller 602. The method 1000 continues by converting, at 1028, via a look up table, the difference into data. The method 1000 continues by providing, 1030, the decoded values.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

What is claimed is:

1. A computer-implemented method for writing to a printed memory device, the computer-implemented method comprising:
   obtaining, at a microcontroller, data to write to the printed memory device;
   segmenting, by the microcontroller, the data into a plurality of data portions;
   determining, by the microcontroller, a plurality of encoding schemes for each of the plurality of data portions, wherein each of the plurality of encoding schemes comprises a voltage and a pulse width to be used to write each of the plurality of data portions;
   providing, by the microcontroller, one or more of the encoding schemes to an application-specific integrated circuit (ASIC);

selecting, by the ASIC, a first target memory cell of the printed memory device corresponding to a first word line and a first bit line for the first data portion of the plurality of data portions to be written;

setting, by the ASIC, unaddressed word lines and bit lines in high impedance;

writing, by the ASIC, the first data portion to the first target memory cell using a first encoding scheme of the plurality of encoding schemes, wherein the first encoding scheme comprises a first voltage and a first pulse width.

2. The computer-implemented method of claim 1, further comprising:

determining, by the microcontroller, that a second data portion of the plurality of data portions is to be written;

selecting, by the ASIC, a second target memory cell of the printed memory device corresponding to a second word line and a second bit line for the second data portion of the plurality of data portions to be written;

setting, by the ASIC, unaddressed word lines and bit lines in high impedance;

writing, by the ASIC, the second data portion to the second target memory cell using a second encoding scheme of the plurality of encoding schemes, wherein the second encoding scheme comprises a second voltage and a second pulse width.

3. The computer-implemented method of claim 2, further comprising:

determining, by the microcontroller, that a third data portion of the plurality of data portions is to be written;

selecting, by the ASIC, a third target memory cell of the printed memory device corresponding to a third word line and a third bit line for the third data portion of the plurality of data portions to be written;

setting, by the ASIC, unaddressed word lines and bit lines in high impedance;

writing, by the ASIC, the third data portion to the third target memory cell using a third encoding scheme of the plurality of encoding schemes, wherein the third encoding scheme comprises a third voltage and a third pulse width.

4. The computer-implemented method of claim 3, further comprising:

determining, by the microcontroller, that a fourth data portion of the plurality of data portions is to be written;

selecting, by the ASIC, a fourth target memory cell of the printed memory device corresponding to a fourth word line and a fourth bit line for the fourth data portion of the plurality of data portions to be written;

setting, by the ASIC, unaddressed word lines and bit lines in high impedance;

writing, by the ASIC, the fourth data portion to the fourth target memory cell using a fourth encoding scheme of the plurality of encoding schemes, wherein the fourth encoding scheme comprises a fourth voltage and a fourth pulse width.

5. The computer-implemented method of claim 2, wherein the first word line and the second word line are a same word line.

6. The computer-implemented method of claim 2, wherein the first bit line and the second bit line are a same bit line.

7. The computer-implemented method of claim 4, wherein the first voltage, the second voltage, the third voltage, and the fourth voltage are within a non-linear region ADC values versus drive voltage curve of the printed memory device.

8. The computer-implemented method of claim 4, wherein the first voltage, the second voltage, the third voltage, and the fourth voltage are between about 1 volt to about 40 volts.

9. The computer-implemented method of claim 4, wherein the first voltage, the second voltage, the third voltage, and the fourth voltage are between 13 volts and about 22 volts.

10. The computer-implemented method of claim 7, wherein the non-linear region corresponds to charge values between about 0.1 nC to about 10 nC.

11. The computer-implemented method of claim 7, wherein the non-linear region corresponds to charge values between about 0.5 nC to about 7 nC.

12. The computer-implemented method of claim 7, wherein the non-linear region is divided into four encoding regimes that correspond to a first charge value less that 1 nC, a second charge value between 3 nC and 5 nC, a third charge value between 5 nC and 6 nC, and a fourth value between 6 nC and 9 nC.

13. The computer-implemented method of claim 2, wherein the first encoding scheme and the second encoding scheme are identical for identical data values of the first data portion and the second data portion.

14. The computer-implemented method of claim 1, wherein each of the data portions comprise a tuple of bit values.

15. A computer-implemented method for reading from a printed memory device, the computer-implemented method comprising:

providing, by a microcontroller, a first control instruction to set a full voltage to an application-specific integrated circuit (ASIC);

providing, by the microcontroller, a first read instruction to the ASIC to read a first portion of a data from a first cell of the printed memory device;

reading, by the ASIC, the first cell, wherein the reading comprises determining a first charge measurement and a second charge measurement;

obtaining, by the microcontroller, the first charge measurement and the second charge measurement from the ASIC;

determining, by the microcontroller, a difference between the first charge measurement and the second charge measurement;

accessing, by the microcontroller, a look-up table to convert the difference to a decoded set of bit values; and providing, by the microcontroller, the decoded bit values.

16. The computer-implemented method of claim 15, wherein the look-up table provides a correspondence between a difference in analog-to-digital count (ADC) values based on the first charge measurement and the second charge measurement and decoded bit values.

17. The computer-implemented method of claim 16, wherein the ADC values are divided into a plurality of non-overlapping ADC value regimes.

18. The computer-implemented method of claim 16, wherein the plurality of ADC values regimes is four ADC value regimes.

19. The computer-implemented method of claim 18, wherein the four ADC value regimes comprise less than 10, between 10 and 70, between 70 and 110, and greater than 110.

20. The computer-implemented method of claim 15, wherein the first charge measurement and the second charge measurement are converted to a first analog-to-digital count (ADC) value and a second ADC value, respectively, by an analog-to-digital converter.

* * * * *